United States Patent
Paranjpe

[11] Patent Number: 5,888,899
[45] Date of Patent: Mar. 30, 1999

[54] METHOD FOR COPPER DOPING OF ALUMINUM FILMS

[75] Inventor: Ajit P. Paranjpe, Sunnyvale, Calif.

[73] Assignee: Texas Instruments Incorporated, Dallas, Tex.

[21] Appl. No.: 829,885

[22] Filed: Apr. 2, 1997

[51] Int. Cl.$^6$ .......................... H01L 21/4763; H01L 21/44
[52] U.S. Cl. .......................... 438/625; 438/634; 438/637; 438/672; 438/687; 438/688
[58] Field of Search ...................................... 438/687, 688, 438/625, 634, 637, 669, 672; 257/762, 765

[56] References Cited

U.S. PATENT DOCUMENTS

| | | | |
|---|---|---|---|
| 3,413,157 | 11/1968 | Kuiper | 257/765 |
| 5,633,199 | 5/1997 | Fiordalice et al. | 438/642 |

*Primary Examiner*—Brian Dutton
*Attorney, Agent, or Firm*—Mark A. Valetti; Carlton H. Hoel; Richard L. Donaldson

[57] ABSTRACT

An embodiment of the instant invention is a method of forming a conductive structure over a semiconductor wafer, the method comprising the steps of: forming a first aluminum layer (14, 24) of a thickness; forming a conductive layer (18,28) of a material which is not readily etched by aluminum-etching etchants on the first aluminum layer, the conuctive layer having a thickness; forming a second aluminum layer (20, 30) on the conductive layer, the second aluminum layer having a thickness; patterning and etching the second aluminum layer thereby exposing a portion of the conductive layer; etching the exposed portion of the conductive layer thereby exposing a portion of the first aluminum layer; etching the exposed portion of the first aluminum layer; subjecting semiconductor wafer to a thermal step thereby diffusing the material in the conductive layer from the conductive layer into the first and second aluminum layers; and wherein the thickness of the conductive layer is much thinner than the thicknesses of the first and second aluminum layers. A plurality of aluminum/conductive/aluminum layers may be formed prior to patterning and etching. Preferably, the material of the conductive layer is comprised of: copper, scandium, tantalum, or vanadium, and the conductive layer is approximately 10 to 30 Å thick and comprised of copper. More preferably, the copper layer is approximately 20 Å thick. Preferably, the first aluminum layer is approximately 1500 to 3000 Å thick, and the second aluminum layer is approximately 1500 to 3000 Å thick.

12 Claims, 2 Drawing Sheets

METHOD FOR COPPER DOPING OF ALUMINUM FILMS

CROSS-REFERENCE TO RELATED PATENT/ PATENT APPLICATIONS

The following commonly assigned patent/patent applications are hereby incorporated herein by reference:

| Patent No./Serial No. | Filing Date | TI Case No. |
| --- | --- | --- |
| 08/826,190 | 03/27/97 | TI-21341 |
| 08/829,886 | 04/02/97 | TI-21215 |

FIELD OF THE INVENTION

The instant invention pertains to semiconductor device fabrication and processing and more specifically to copper doping of aluminum films.

BACKGROUND OF THE INVENTION

Interconnects for future generations of integrated microcircuits need to be both highly conductive and electromigration resistant. Copper doping of aluminum interconnects significantly improves electromigration resistance due to the precipitation of $CuAl_2$, or a sub-stoichiometric alloy along the grain boundaries. These grain boundary precipitates retard grain boundary diffusion in the thin films, thereby reducing total mass transport and improving electromigration resistance. The $CuAl_2$ precipitates at grain boundaries and triple points are formed after annealing Al—Cu films at 425° C. Similarly Al—Cu thin films annealed at 200° to 300° C. are enriched with copper at the aluminum grain boundaries.

Copper doping can be achieved by sputtering an Al—Cu film or by annealing a sandwiched stack of Al and a pure Cu or Cu containing film. In situ sputtered copper-containing films have been used as copper doping sources for chemical vapor deposited (CVD) aluminum at temperatures as low as 230° C. Diffusion of copper from the copper containing film can result in a copper concentration in the CVD Al approaching solid solubility limits. From a sputtered pure copper source a maximum of 0.37 wt. % of copper is incorporated into the aluminum film. The copper containing film may also be deposited using metal-organic CVD (MOCVD) precursors. A small amount of copper diffuses into the aluminum layer during deposition, and complete diffusion of the copper into the aluminum is achieved by a rapid thermal anneal at a higher temperature.

Typically, electromigration characteristics improve with increasing copper doping in the range of zero to two weight percent. However Al—Cu alloys with copper levels above one weight percent are difficult to etch. This is due to the fact that copper byproducts formed during the etch have extremely low vapor pressure and form residues during the etch. These residues can make the etched surface rough as well as result in micromasking and uneven etching.

It is, therefore, an object of the instant invention to provide a method for introducing copper into an aluminum film and still being able to effectively and efficiently etch the Al—Cu film.

SUMMARY OF THE INVENTION

An embodiment of the instant invention is a method of forming a conductive structure over a semiconductor wafer, the method comprising the steps of: forming a first aluminum layer of a thickness; forming a conductive layer of a material which is not readily etched by aluminum-etching etchants on the first aluminum layer, the conuctive layer having a thickness; forming a second aluminum layer on the conductive layer, the second aluminum layer having a thickness; patterning and etching the second aluminum layer thereby exposing a portion of the conductive layer; etching the exposed portion of the conductive layer thereby exposing a portion of the first aluminum layer; etching the exposed portion of the first aluminum layer; subjecting semiconductor wafer to a thermal step thereby diffusing the material in the conductive layer from the conductive layer into the first and second aluminum layers; and wherein the thickness of the conductive layer is much thinner than the thicknesses of the first and second aluminum layers. A plurality of aluminum/conductive/aluminum layers may be formed prior to patterning and etching. Preferably, the material of the conductive layer is comprised of: copper, scandium, tantalum, or vanadium, and the conductive layer is approximately 10 to 30 Å thick and comprised of copper. More preferably, the copper layer is approximately 20 Å thick. Preferably, the first aluminum layer is approximately 1500 to 3000 Å thick, and the second aluminum layer is approximately 1500 to 3000 Å thick.

Another embodiment of the instant invention is a method of forming a conductive structure over a semiconductor wafer, the method comprising the steps of: forming a first aluminum layer of a first thickness; forming a copper layer on the first aluminum layer, the copper layer having a thickness; forming a second aluminum layer on the copper layer, the second aluminum layer having a second thickness; subjecting semiconductor wafer to a thermal step thereby diffusing copper from the copper layer into the first and second aluminum layers; patterning and etching the first and second aluminum layers and the copper layer; and wherein the thickness of the copper layer is much thinner than the thicknesses of the first and second aluminum layers. Preferably, the copper layer is approximately 10 to 30 Å, and the first and second aluminum layer are approximately 1500 to 3000 Å thick. In another embodiment, a plurality of aluminum/copper/aluminum layers may be formed prior to patterning and etching.

DETAILED DESCRIPTION OF THE DRAWINGS

Figure 1A:
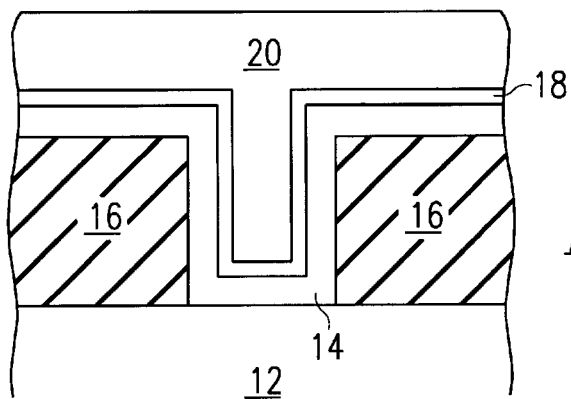
FIGS. 1a through 1c are cross-sectional views illustrating a contact/via plug and interconnect formed using the method of one embodiment of the instant invention.
Figure 1B:
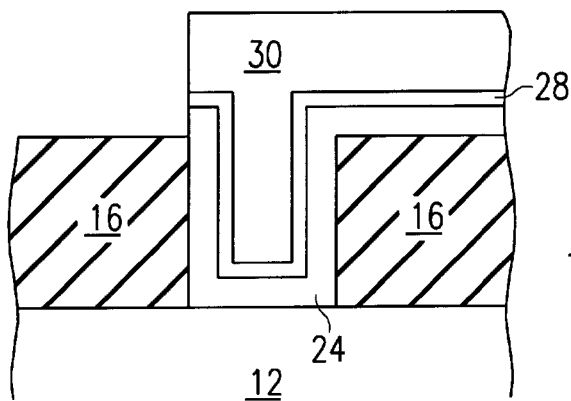
Figure 1C:
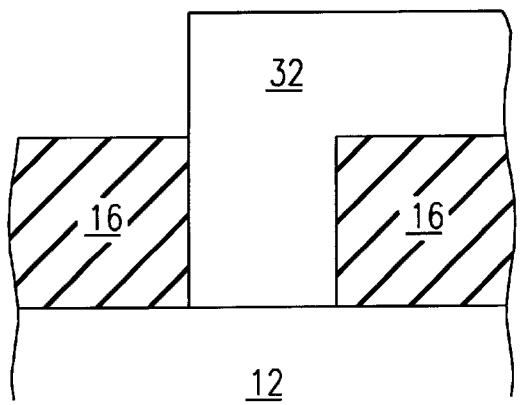

While FIGS. 1a through 1c specifically illustrate a contact plug and an interconnect, the method of the instant invention is equally applicable to the formation of a via plug and interconnect. After forming a interlevel dielectric layer (such a dielectric layer does not have to be formed; this method is applicable even without such a dielectric layer) on substrate 12, the dielectric layer is patterned and etched so as to form the opening for the contact/via. After the opening is formed, a stack of metals is formed so as to fill the opening and provide several layers of metal on the interlevel dielectric layer. Preferably, the metal stack is comprised of one or more thin layers of copper (or any other metal which will enhance the electromigration resistance properties of aluminum) sandwiched between several thicker layers of aluminum. Preferably, each layer of copper (depicted as layer 18 of FIG. 1*a*) is between 10 and 50 Å thick (more preferably each layer of copper is between 10 and 30 Å thick—even more preferably, each copper layer would be approximately 20 Å thick). In addition, it is preferable that only one or two thin layers (approximately 20 Å thick) of copper be used for an Al—Cu stack which is a total of 6000 Å thick. FIG. 1*a* illustrates a preferable stack. The stack of FIG. 1*a* is comprised of a layer of aluminum (layer 14) which is beneath a very thin layer of copper (layer 18) (preferably a CVD Cu film or a PVD Cu film), and a second aluminum layer 20 is formed over thin copper layer 18. Preferably, aluminum layer 14 is approximately 1500–3000 Å thick, aluminum layer 20 is approximately 1500–3000 A thick, and copper layer 18 is approximately 20 Å thick.

Referring to FIG. 1*b*, after the Al/Cu/Al stack is formed an etch step is preferably performed so as to pattern the interconnect. Preferably, the etch step is comprised of a multi-step dry etch process. This dry etch process would preferably be comprised of an etch step to etch back aluminum layer 20 back to form aluminum layer 30 and thereby exposing portions of copper layer 18. This would be followed by a short sputter etch which would remove the exposed portions copper layer 18 (thereby exposing portions of aluminum layer 14 and patterning copper layer 28), and a subsequent patterning and etching step is performed so as to remove the exposed portions of aluminum layer 14 (thereby forming patterned aluminum layer 24).

Referring to FIG. 1*c*, after the stack is etched a sinter step is performed so as to diffuse the copper uniformly throughout the stack (thereby forming Al—Cu layer 32). This sinter step may be performed prior to etching, however this may cause etching problems if the amount of copper that is being etched is greater than about 1.5 wt. % of the total stack. However, process flow illustrated in FIGS. 1*a*–1*c* should be easily patterned and etched because of the relative ease of sputter etching thin films of copper. It is also important to note that while several thin layers of copper sandwiched between thicker aluminum layers should not cause etching problems, it may cause diffusion problems if the amount of copper is so great so as to greatly exceed the solid solubility at the annealing temperature. If the solid solubility is exceeded CuAl$_2$ precipitates are formed in the boundary region between the copper and the aluminum film which obstructs further diffusion of copper past this boundary region. As a result of this diffusion barrier portions of the aluminum film remain undoped.

Figure 2:
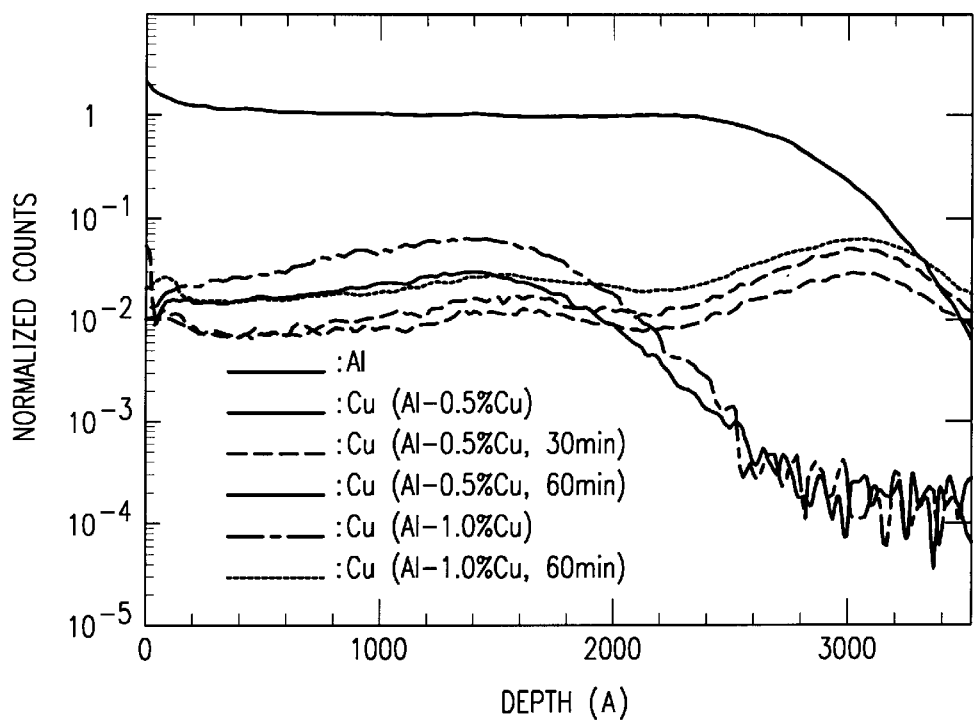
FIG. 2 is a SIMS depth profile of copper in a PVD AlCu/CVD Al stack as-deposited and after a 450° C. sinter.

FIG. 2 shows a SIMS distribution profile of copper in the as-deposited sandwich film of 1500 Å PVD Al—Cu over a 1500 Å CVD Al layer and after a 30 minute and 60 minute anneal of the sandwich structure at 450° C. In the as-deposited layers, the copper is confined to the PVD Al—Cu region for both the Al-0.5% Cu and Al-1% Cu films. However, the copper is uniformly distributed through the Al matrix after annealing. For the Al-1% Cu/CVD Al stack, the copper concentration, after annealing, is approximately twice the concentration for the Al-0.5% Cu/CVD Al stack.

Figure 3:
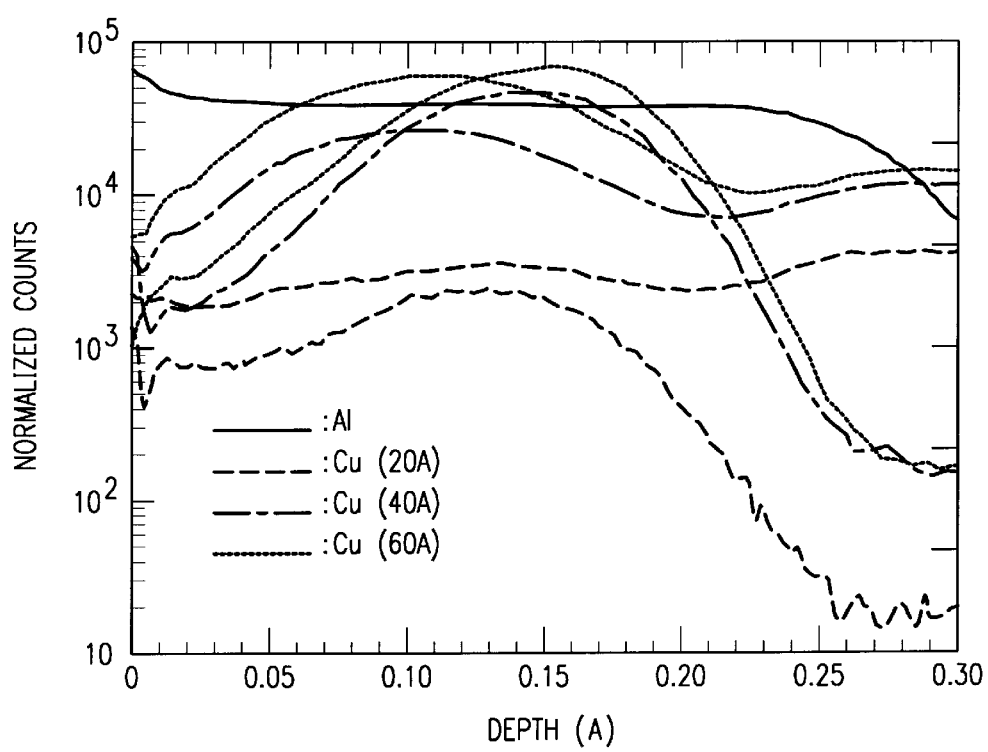
FIG. 3 is a SIMS depth profile of copper in a PVD AlCu/CVD Cu/CVD Al stack as-deposited and after a 450° C. sinter.

FIG. 3 illustrates similar results as the embodiment illustrated in FIG. 2, except the SIMS distribution profile of FIG. 3 reflects a sandwich stack of PVD Al—Cu/CVD Cu/CVD Al. In the as-deposited stack, the copper concentration at the surface is approximately equal to the intrinsic copper concentration in the PVD Al—Cu layer. In addition, it increases at the interface between the PVD Al—Cu and the CVD Cu layer and is at a lower value in the CVD Al layer. The concentration gradients in the as-deposited film are actually sharp, but appear diffuse due to broadening induced by the SIMS sputter profiling technique.

After annealing, the copper distribution profile changes considerably. If a 20 Å CVD Cu film is used in the sandwich, the copper diffuses uniformly throughout the matrix during the anneal. However, if the CVD Cu thickness is increased (to approximately 40 to 60 Å), the copper is not uniformly diffused in the matrix (even after a 60 minute anneal at 450° C.). For the thicker CVD Cu layers, some diffusion of the copper does occur, but there is a noticable peak in the copper concentration at the interface between the PVD Al—Cu and CVD Al layers. This indictes that only a part of the copper from the CVD Cu layer has diffused and that most of the CVD Cu layer remains intact. In other words, if the CVD Cu layer is too thick (thicker than approximately 30 Å), the copper will precipitate in the Al matrix and prevent further diffusion of the copper. Thus, the Al matrix will not be uniformly doped with copper. To achieve uniform doping of the Al matrix, the thickness of the CVD Cu layer should preferably be carefully controlled so as to be between approximately 10 and 30 Å.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What I claim is:

1. A method of forming a conductive structure over a semiconductor wafer, said method comprising the steps of:

forming a first aluminum layer of a thickness;

forming a conductive layer of a material which is not readily etched by aluminum-etching etchants on said first aluminum layer, said conuctive layer having a thickness;

forming a second aluminum layer on said conductive layer, said second aluminum layer having a thickness;

patterning and etching said second aluminum layer thereby exposing a portion of said conductive layer;

etching said exposed portion of said conductive layer thereby exposing a portion of said first aluminum layer;

etching said exposed portion of said first aluminum layer;

subjecting said semiconductor wafer to a thermal step thereby diffusing said material in said conductive layer from said conductive layer into said first and second aluminum layers;

and wherein said thickness of said conductive layer is much thinner than said thicknesses of said first and second aluminum layers.

2. The method of claim 1, wherein a plurality of aluminum/conductive/aluminum layers may be formed prior to said steps of patterning and etching.

3. The method of claim 1, wherein said material of said conductive layer is comprised of: copper, scandium, tantalum, or vanadium.

4. The method of claim 1, wherein said conductive layer is approximately 10 to 30 Å thick and comprised of copper.

5. The method of claim 4, wherein said conductive layer is approximately 20 Å thick.

6. The method of claim 1, wherein said first aluminum layer is approximately 1500 to 3000 Å thick.

7. The method of claim 1, wherein said second aluminum layer is approximately 1500 to 3000 Å thick.

8. A method of forming a conductive structure over a semiconductor wafer, said method comprising the steps of:

forming a first aluminum layer of a first thickness;

forming a copper layer on said first aluminum layer, said copper layer having a thickness;

forming a second aluminum layer on said copper layer, said second aluminum layer having a second thickness;

subjecting semiconductor wafer to a thermal step thereby diffusing copper from said copper layer into said first and second aluminum layers;

patterning and etching said first and second aluminum layers and said copper layer;

and wherein said thickness of said copper layer is much thinner than said thicknesses of said first and second aluminum layers.

9. The method of claim 8, wherein said copper layer is approximately 10 to 30 Å.

10. The method of claim 8, wherein said first aluminum layer is approximately 1500 to 3000 Å thick.

11. The method of claim 8, wherein said second aluminum layer is approximately 1500 to 3000 Å thick.

12. The method of claim 8, wherein a plurality of aluminum/copper/aluminum layers may be formed prior to patterning and etching.

* * * * *

UNITED STATES PATENT AND TRADEMARK OFFICE
CERTIFICATE OF CORRECTION

PATENT NO. : 5,888,899
DATED : March 30, 1999
INVENTOR(S) : Paranjpe

It is certified that error appears in the above-identified patent and that said Letters Patent is hereby corrected as shown below:

Title page, insert the following:

---[60] Provisional application No. 60/014,874, Apr. 4, 1996 ---.

Column 1, line 4, insert the following:

---CROSS REFERENCE TO RELATED APPLICATION
Reference is made to and priority claimed from U.S. Provisional Application Serial No. 60/014,874, filed Apr. 4, 1996, entitled Copper Doping of Aluminum Films. ---

Signed and Sealed this

Twenty-fifth Day of July, 2000

Attest:

Q. TODD DICKINSON

*Attesting Officer*

*Director of Patents and Trademarks*